United States Patent [19]

Gray

[11] Patent Number: 4,692,704

[45] Date of Patent: Sep. 8, 1987

[54] SLICE THICKNESS AND CONTIGUITY PHANTOM FOR A MAGNETIC RESONANCE IMAGING SCANNER

[75] Inventor: Joel E. Gray, Rochester, Minn.

[73] Assignee: Mayo Medical Resources, Rochester, Minn.

[21] Appl. No.: 826,747

[22] Filed: Feb. 6, 1986

[51] Int. Cl.⁴ ............................................. G01R 33/20
[52] U.S. Cl. .................................... 324/318; 324/300
[58] Field of Search .............. 324/300, 307, 309, 318; 128/653; 250/252.1; 378/207; 206/445

[56] References Cited

U.S. PATENT DOCUMENTS

| | | | |
|---|---|---|---|
| 2,175,058 | 10/1939 | Knapp | 206/455 |
| 2,983,369 | 5/1961 | Rogovin | 206/445 |
| 3,549,226 | 12/1970 | Samson | 206/445 |
| 3,555,407 | 1/1971 | Bozanic et al. | 324/300 |
| 3,708,946 | 1/1973 | Cahill | 206/445 |
| 4,549,655 | 10/1985 | Forsythe, Jr. et al. | 206/445 |

Primary Examiner—Stewart J. Levy
Assistant Examiner—Kevin D. O'Shea
Attorney, Agent, or Firm—Marshall & Melhorn

[57] ABSTRACT

A phantom for evaluating the operating performance of a magnetic resonance imaging scanner system includes a generally tubular body enclosed at its ends and containing a cylindrical stack of a plurality of leaves. Each leaf has one or more wedge-shaped slices or sectors cut out for identification and reference purposes. Leaves having one, two and four slices formed therein are arranged in a predetermined order in the stack with the slices in a predetermined helical pattern approximately eighteen degrees apart. The container is filled with a liquid and is inserted in the magnetic resonance imaging system to obtain images which can be evaluated to determine if the system is in calibration. A typical evaluation determines MRI slice thickness, slice location, and contiguity of the slices.

32 Claims, 7 Drawing Figures

SLICE THICKNESS AND CONTIGUITY PHANTOM FOR A MAGNETIC RESONANCE IMAGING SCANNER

BACKGROUND OF THE INVENTION

The present invention relates, in general, to a device for calibrating a magnetic resonance imaging system and, in particular, to a multislice phantom for determining slice thickness, slice location and contiguity between slices.

Most prior art imaging systems involve the use of radiation in the form of X-rays and the like. There are many methods for evaluating the performance of an imaging system with respect to a number of parameters such as uniformity, linearity, spatial resolution, count efficiency and image distortion. A device known as a phantom is commonly utilized as a calibration device.

U.S. Pat. No. 4,280,047 discloses one form of phantom comprising a rectangular sealed container filled with a liquid to simulate clinical scattering. The container surrounds five interior steps extending across its width in a linear depth progression. Identical groupings of lead disks are placed on each step and each group includes several subgroups of disks arranged across the step in a linear progression of width sizes and spacings. The disks absorb radiation from a known source to a predetermined degree such that a reading from the system can be compared with a standard reading that should be obtained with the phantom.

Another form of absorption resolution testing device is shown in U.S. Pat. No. 4,323,782. This device includes a vessel containing a liquid which has an X-ray radiation absorption value approximately equal to living tissue and a plurality of smaller vessels disposed within the vessel and the liquid. A second liquid is disposed within the smaller vessels and has absorption values which are different from the absorption value of the first liquid in the vessel.

U.S. Pat. No. 4,400,827 shows a circular wedge in the form of a ramp or a series of steps which is rotated in synchronism with the frames of film in a photographing means.

A test pattern device for testing scintillation cameras is disclosed in U.S. Pat. No. 4,419,577. The device has a radiation transparent body member with internal mercury-filled communicating passages that define a calibrated radiation opaque test pattern. The body member is formed by securing a plastic cover plate to a plastic base molded with grooves to form the test pattern passages and filling ports, and then sealing the filling ports after mercury has been added to fill the passages.

U.S. Pat. No. 4,460,832 discloses a nuclear radiation attenuator for providing a test image from a source of radiation. The body of the attenuator is formed by a stack of plates aligned in parallel relation to each other and having apertures formed therein. Thus, for example, radiation from a source is attenuated by both plates in a background region without apertures, is attenuated by the first plate in a target region in which only the first plate has an aperture formed, and is attenuated by neither plate in another target region in which both plates have apertures formed.

U.S. Pat. No. 4,472,829 discloses a radiographic phantom for simulating a blood vessel. A base is composed of a non-iodinated material and has a channel formed therein which is filled with a similar material but with minute amounts of iodine suspended uniformly therein to represent a blood vessel.

A radiography calibrating device is disclosed in U.S. Pat. No. 4,497,061 in the form of a sectoral shaped calibration member made up of four layers. In addition to, or instead of being of different thicknesses, the layers may be of different materials. The calibration member is lowered step-wise into the path of a fan-shaped sweep of penetrative radiation so that the amount of radiation that passes through each layer of the calibrating member is monitored by the detecting means.

In order to see what is going on inside the human body, one has either had to perform exploratory surgery or utilize some form of radiography. Now however, more detailed information is being generated by a magnetic resonance imaging scanner. The body is subjected to a powerful magnetic field which aligns the atoms of the body in a north-south orientation. An FM radio signal is transmitted through the body vibrating the molecules until they flip upside down. When the radio signal is terminated, the molecules flip back turning each atom into a tiny FM radio station whose signals are detected by the scanner. In order to calibrate such a machine, a calibration device or phantom must be utilized.

SUMMARY OF THE INVENTION

The present invention relates to a phantom for evaluating the operating performance of a magnetic resonance imaging scanner system. A cylindrical plastic container is filled with a liquid. A plurality of disk-shaped leaves are stacked on top of one another inside the container. Each leaf has one or more wedge-shaped slices or sectors cut out for identification and reference. The container is inserted in the magnetic resonance imaging system, an image produced and readings are taken of the indicated slice thickness, slice location and contiguity between the leaves for checking the operating performance of the system.

DESCRIPTION OF THE PREFERRED EMBODIMENT

Figure 1:
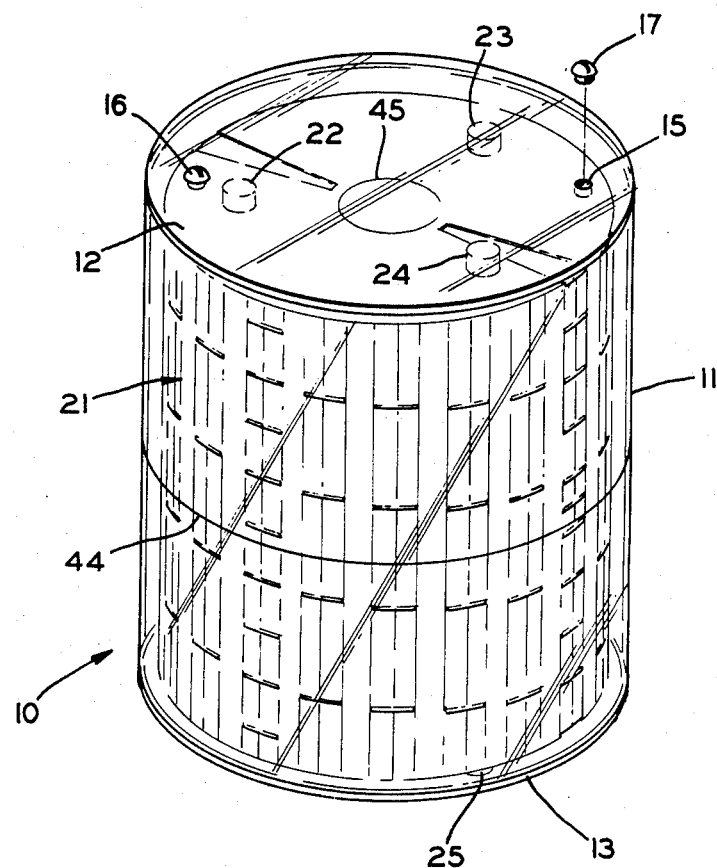
FIG. 1 is a perspective view of a magnetic resonance imaging phantom in accordance with the present invention.
Figure 2:
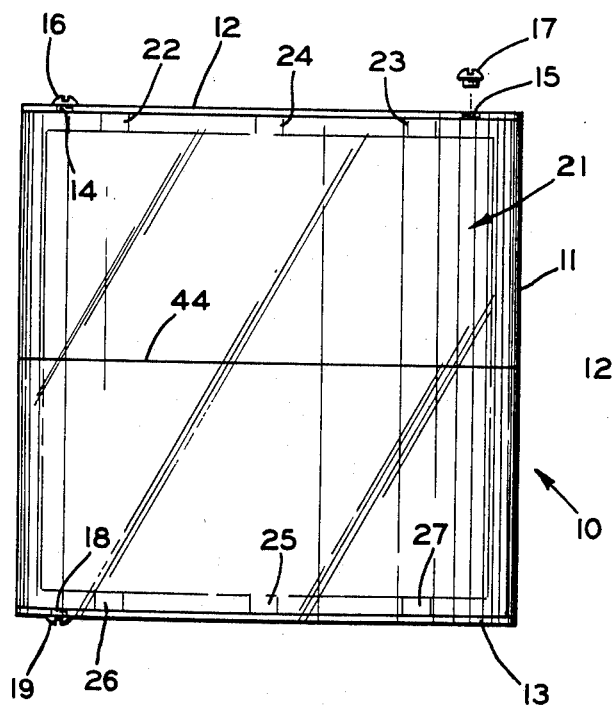
FIG. 2 is a side elevational view of the phantom in FIG. 1.
Figure 3:
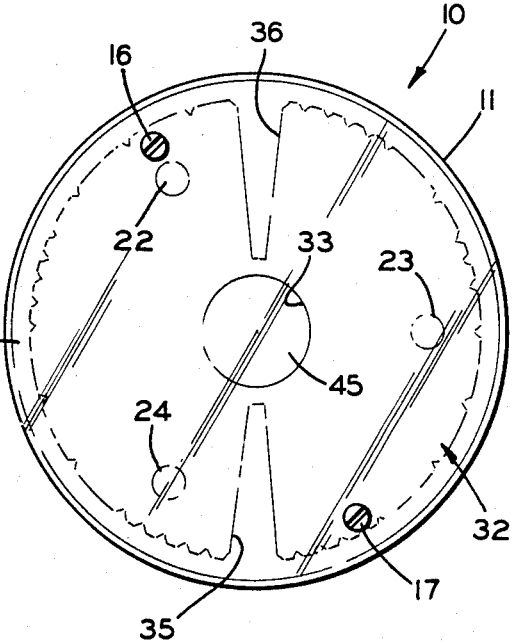
FIG. 3 is a top plan view of the phantom shown in FIG. 1.

Referring to FIGS. 1 through 3, there is shown a phantom 10 having a hollow enclosure formed as a generally tubular body 11 closed at the ends by a top end cap 12 and a bottom end cap 13. Although the body 11 is shown as a cylinder of revolution in cross-section it can be formed in any other suitable shape. The body and the end caps are formed of a transparent material such as an acrylic plastic and are attached together by any suitable means such as an adhesive, to produce a fluid tight container. The top end cap 12 can have one or more apertures formed therein for filling the container with the liquid. For example, apertures 14 and 15 are formed in the top end cap 12 at diametrically opposed positions. The holes or apertures 14 and 15 can be closed by any removable plug means such as a pair of plugs 16 and 17 which are threaded to engage threads formed in the apertures 14 and 15 to close the apertures against fluid flow. The head of each of the plugs 16 and 17 is slotted to accept a tool such as a screwdriver for threading each of the plugs into and out of the respective aperture. One of the apertures, 14 for example, can be utilized to receive liquid when the phantom is to be filled and the other aperture, 15 for example, can be utilized to allow air to escape from the interior of the tubular body 11 as the liquid is being inserted.

An aperture 18 can be formed in the bottom end cap 13 and can be closed with a plug 19 similar to the plugs 16 and 17. The aperture 18 can be utilized to drain fluid from the interior of the tubular body 11 with one or both of the apertures 14 and 15 open to allow air to enter the tubular body as the liquid exits the tubular body.

Enclosed in the tubular body 11 is a stack 21 of individual leaves. The top of the stack 21 is spaced from the interior surface of the top end cap 12 by one or more spacers such as the cylindrical spacers 22, 23 and 24. The spacers can be attached to the interior surface of the top end cap 12 by any suitable means such as an adhesive. Similarly, the bottom of the stack 21 is spaced from the interior surface of the bottom end cap 13 by a plurality of spacers 25, 26 and 27 which are attached to the bottom end cap 13.

Typically, the phantom 10 is assembled by attaching the spacers to the corresponding end caps, attaching one of the end caps to the corresponding end of the tubular body 11, inserting the stack 21 of leaves, and then attaching the other end cap to the other end of the tubular body 11.

Satisfactory results have been obtained in one type of magnetic resonance imaging scanner with an approximately eighteen centimeter tall stack of leaves approximately eighteen centimeters in diameter. The top, bottom and sides of the stack 21 are spaced approximately one half centimeter from the interior surfaces of the body 11 and the end caps 12 and 13.

Figure 4:
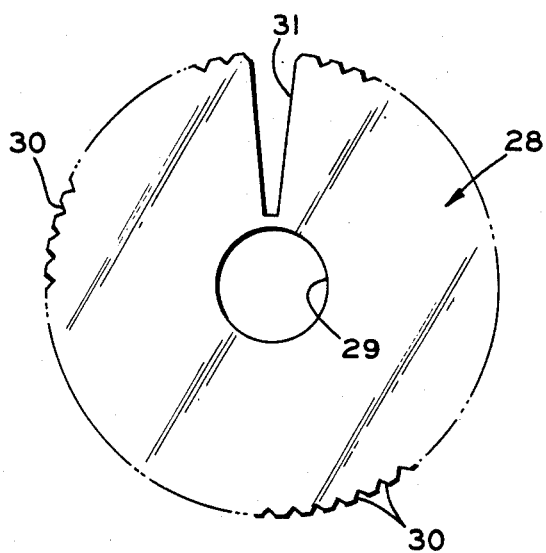
FIG. 4 is a plan view of a type "A" leaf used in the phantom of FIG. 1.

There is shown in FIG. 4 a leaf "A" which is one of three types of leaves utilized in the stack 21. The leaf 28 is approximately eighteen centimeters in diameter with an approximately four centimeter diameter hole 29 formed in the center thereof. A plurality of notches 30 are formed in the peripheral edge of the leaf 28 approximately six degrees apart. Less than all of the notches are shown in FIG. 4 in order to simplify the illustration. An approximately twelve degree sector or wedge-shaped slice 31 is formed in the leaf 28 diametrically opposite one of the notches 30.

Figure 5:
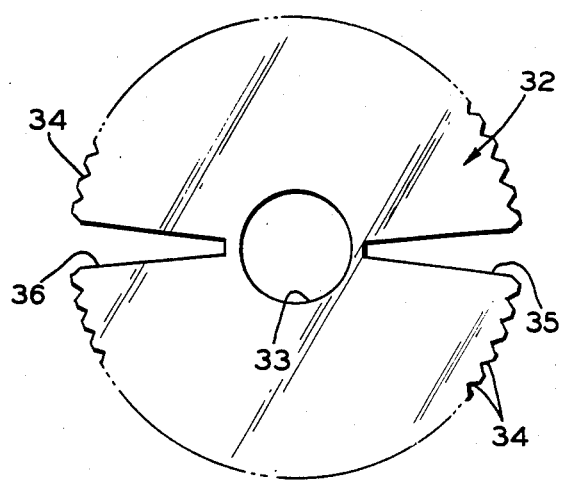
FIG. 5 is a plan view of a type "B" leaf utilized in the phantom of FIG. 1.

There is shown in FIG. 5 a leaf "B" 32 which is similar to the leaf "A" 28 shown in FIG. 4. A center aperture 33 is formed in the leaf 32 and a plurality of notches 34 are formed about the periphery of the leaf approximately every six degrees. A pair of diametrically opposed approximately twelve degree wedge-shaped slices 35 and 36 are formed in the leaf 32 replacing two of the notches 34.

Figure 6:
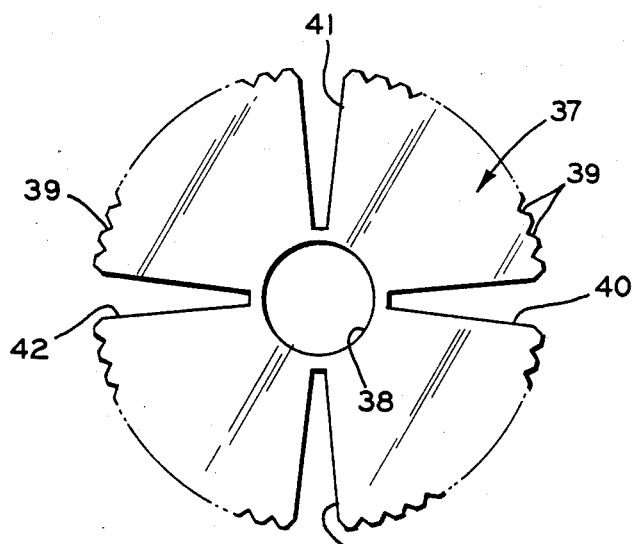
FIG. 6 is a plan view of a type "C" leaf used in the phantom of FIG. 1.

There is shown in FIG. 6 a leaf "C" 37 which is similar to the leaves 28 and 32. The leaf 37 has a central aperture 38 formed therein and a plurality of notches 39 formed about the periphery thereof approximately every six degrees. Four approximately twelve degree wedge-shaped slices 40, 41, 42 and 43 are formed in the leaf 37 approximately ninety degrees apart replacing twelve of the notches 39.

Figure 7:
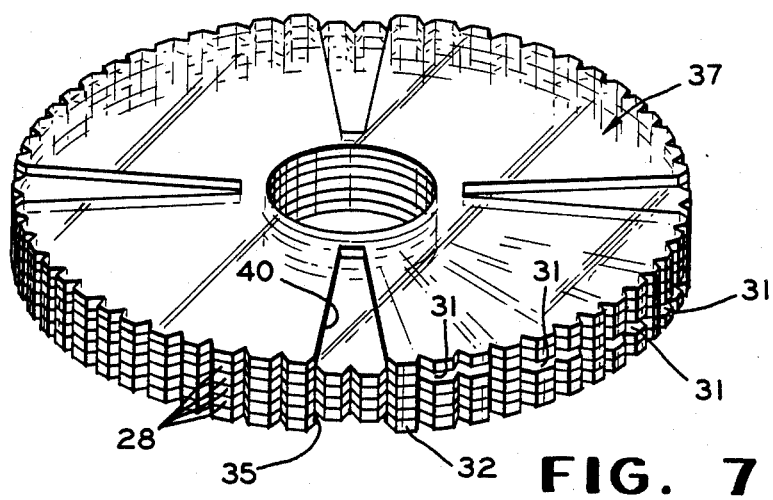
FIG. 7 is a perspective view of a stack of the leaves shown in FIGS. 4 through 6.

The leaf "C" 37 is utilized in the center of the stack 21 and is positioned at a line 44 scribed about the periphery of the center of the tubular body 11 as shown in FIG. 2. A portion of the stack 21 is shown in FIG. 7. Stacked below the leaf 37 is a series of four leaves "A" 28. The leaf "A" adjacent the leaf "C" has its slice 31 rotated in a counterclockwise direction as viewed from above. The pie-shaped slice 31 is rotated eighteen degrees in a counterclockwise direction from the wedge-shaped slice 40 of the leaf "C". Each of the leaves "A" has its slice 31 rotated eighteen degrees from the slice 31 of the leaf above it.

Stacked below the four leaves "A" is a leaf "B" 32 having the slice 35 aligned with the slice 40 of the leaf "C". The portion of the stack 21 below leaf "B" 32 shown in FIG. 7 consists of eight sets of four leaves "A" and one leaf "B" for a total of forty-five leaves below the leaf "C". The top of the stack 21 (not shown) begins with a leaf "B" followed by four leaves "A". There are nine sets of these leaves above the leaf "C" for a total of ninety-one leaves in the stack 21. Each leaf is approximately two millimeters thick such that the stack 21 is approximately eighteen centimeters thick.

The slices of the leaves are arranged in a pattern to produce a predetermined image from a magnetic resonance imaging system. If we begin at the top of the stack 21 with the first leaf "B", we can assign the zero degree and one hundred eighty degree positions to the two slices 35 and 36. The leaf "A" under the top leaf "B" has its slice 31 positioned eighteen degrees in a counter-clockwise direction from the slice 35 when viewing the stack 21 from the top as shown in FIG. 3. The second through the fourth leaves "A" will have slices positioned at the thirty-six, fifty-four, and seventy-two degree positions. The second leaf "B" will have its two slices positioned at the ninety and two hundred seventy degree positions.

Each leaf in the stack 21 is rotated eighteen degrees in a counterclockwise direction from the leaf immediately above it. The leaf "A" immediately below the leaf "C" is rotated as if the leaf "C" had been a leaf "B". Thus, the stack 21 has eleven slices positioned at the zero degree location, nine slices at the ninety degree position, eleven slices at the one hundred eighty degree position, and nine slices at the two hundred seventy degree position. The leaves, combine to position a slice every eighteen degrees for four and one half revolutions of the stack 21.

The stack 21 can be constructed by assembling the leaves on a cylindrical post 45. The post 45 is of a diameter that the apertures 29, 33, and 38 of the leaf "A", leaf "B", and leaf "C" respectively are a press fit. The notches 30, 34 and 39 can be utilized to vertically align the leaves as they are being stacked on the post 45.

The dimensions given in the above example are illustrative only. The dimensions and the cross-sectional shape can be varied to accommodate various types of magnetic resonance imaging systems. The thickness of the leaves can be varied, but the leaf thickness should be less than the minimum thickness to be measured by the system in actual use. Also, other types of plastics or non-metallic materials could be utilized to construct the phantom.

In accordance with the provisions with the patent statutes, the principle and mode of operation of the present invention have been explained and illustrated in its preferred embodiment. However, it must be understood that the present invention can be practiced otherwise than as specifically explained and illustrated without departing from its spirit or scope.

What is claimed is:

1. A phantom for calibrating a magnetic resonance imaging system comprising:
   a hollow enclosure adapted to be inserted into a magnetic resonance imaging system;
   a plurality of generally planar leaves positioned in a stacked relationship, each leaf having a portion thereof removed to form a slice, said leaves being oriented in said stack with said slices in predetermined positions; and
   means for attaching said stack of leaves inside said hollow enclosure whereby said leaves form a predetermined calibration image upon being subjected to a magnetic field in a magnetic resonance imaging system.

2. A phantom according to claim 1 wherein said hollow enclosure includes a generally tubular body and a pair of generally planar end caps attached to said tubular body and enclosing either end thereof.

3. The phantom according to claim 2 wherein one of said end caps is a top end cap having an aperture formed therein for permitting a liquid to be inserted into the interior of said hollow enclosure.

4. The phantom according to claim 3 including a removable closure for said aperture.

5. The phantom according to claim 4 wherein said aperture has threads formed on a wall thereof and said closure has complimentary threads formed thereon whereby said closure is retained in said aperture by engagement of said threads.

6. The phantom according to claim 3 wherein said top end cap includes another aperture formed therein for permitting gas to escape from the interior of said hollow enclosure.

7. The phantom according to claim 6 including a pair of removable closures, one for closing each of said apertures.

8. The phantom according to claim 2 wherein one of said end caps is a bottom end cap having an aperture formed therein for permitting liquid to be removed from the interior of said hollow enclosure.

9. The phantom according to claim 8 including a removable closure having threads formed thereon and wherein said aperture has complimentary threads formed on an interior wall thereof for releasably retaining said removable closure.

10. The phantom according to claim 1 wherein said generally planar leaves are formed as cylinders of revolution and are stacked in an end to end relationship.

11. The phantom according to claim 10 wherein the diameters of said leaves are substantially the same, the diameter being substantially greater than the length of each of said leaves.

12. The phantom according to claim 11 wherein the diameter of said leaves is approximately ninety times the length of said leaves.

13. The phantom according to claim 11 wherein the diameter of each of said leaves is approximately eighteen centimeters and the length of each of said leaves is approximately two millimeters.

14. The phantom according to claim 10 wherein said slices are generally wedge-shaped.

15. The phantom according to claim 14 wherein said slices are formed along a radius of said leaf, said slices being wider at a periphery of said leaf and narrower toward the center of said leaf.

16. The phantom according to claim 14 wherein said slices are formed along a radius of said leaves as an approximately twelve degree sector.

17. The phantom according to claim 10 wherein at least one of said leaves has a different number of slices formed therein than another one of said leaves.

18. The phantom according to claim 10 wherein said leaves include a first type of leaf having one slice formed therein, a second type of leaf having two slices formed therein at diametrically opposed positions, and a third type of leaf having four slices formed therein approximately ninety degrees apart.

19. The phantom according to claim 1 wherein said means for attaching said stack includes a plurality of spacers, each of said spacers abutting said stack and abutting an interior wall of said hollow enclosure.

20. A phantom for calibrating a magnetic resonance imaging system comprising:
    a generally tubular body adapted to be inserted into a magnetic resonance imaging system;
    a pair of end caps attached to and enclosing the ends of said tubular body; and
    a plurality of generally planar leaves positioned in a stacked relationship inside said tubular body, each of said leaves having a portion removed to form a slice therein, said leaves oriented with said slices in predetermined positions whereby said leaves form a predetermined calibration image upon being subjected to a magnetic field in a magnetic resonance imaging system.

21. The phantom according to claim 20 including at least one aperture formed in one of said end caps for permitting liquid to be inserted into the interior of said tubular body, for permitting gas to escape from the interior of said tubular body and for permitting liquid to be drained from the interior of said body.

22. The phantom according to claim 20 including at least one aperture formed in each of said end caps, each of said apertures having threads formed in a wall thereof, and a removable closure having complimentary threads formed thereon for closing each of said apertures.

23. The phantom according to claim 20 including support means for retaining said leaves in a predetermined location inside said tubular body.

24. The phantom according to claim 23 wherein said support means includes a plurality of generally cylindrical spacers each having one end abutting said stack of leaves and another end abutting an interior wall of one of said end caps.

25. The phantom according to claim 20 wherein each of said leaves is formed as a cylinder of revolution having a diameter substantially greater than its length, said leaves being stacked in end to end relationship.

26. The phantom according to claim 25 wherein each of said leaves has a slice formed at the periphery thereof, said leaves being oriented such that each slice is positioned eighteen degrees from the slices of the leaves on either side of any of said leaves.

27. A phantom for calibrating a magnetic resonance imaging system comprising:

a generally tubular body enclosed at both ends and adapted to be inserted into a magnetic resonance imaging system, and a stack of leaves enclosed within said tubular body, each of said leaves being generally cylindrical in shape and having a diameter substantially greater than its length, said leaves being positioned in end to end relationship in said stack, each of said leaves having a portion thereof removed to form a radially oriented slice, said leaves being oriented in said stack with said slices in predetermined positions whereby said leaves form a predetermined calibration image upon being subjected to a magnetic field in a magnetic resonance imaging system.

28. The phantom according to claim 27 wherein said slices are generally wedge-shaped being wider at a periphery of said leaves and narrower toward a center of said leaves.

29. The phantom according to claim 27 wherein said leaves include at least one leaf having a single slice formed therein, at least one other leaf having two diametrically opposed slices formed therein, and at least another leaf having four slices formed therein spaced equidistantly about the periphery of said leaf.

30. The phantom according to claim 27 wherein each of said leaves has at least one slice formed therein, said slices being oriented in helical fashion about the periphery of said stack approximately every eighteen degrees.

31. The phantom according to claim 30 wherein each of said slices is generally wedge-shaped having a wider opening at a periphery of said leaf and a narrower end at a center of said leaf, said slices being formed as approximately twelve degree sectors of said leaves.

32. The phantom according to claim 27 wherein each of said leaves has a plurality of notches formed in a periphery thereof.

* * * * *